United States Patent Office 3,676,252

Patented July 11, 1972

3,676,252

METHOD OF ELECTRICALLY MOUNTING COMPONENTS IN HYBRID CIRCUITS

Trevor Richard Allington, Indianapolis, Ind., assignor to RCA Corporation

No Drawing. Filed Apr. 13, 1970, Ser. No. 28,108
Int. Cl. B32b *33/00*
U.S. Cl. 156—277 2 Claims

ABSTRACT OF THE DISCLOSURE

In mounting components such as ceramic chip capacitors on insulating substrates so as to make good electrical connection with a conducting area of the substrate, a solventless conducting composition is screen printed on the mounting surface and the chip is pressed into the composition. The composition comprises a low viscosity liquid epoxy resin, a hardener for the resin, and a relatively high proportion of silver powder.

BACKGROUND OF THE INVENTION

An economical method of forming electrical conductors on a ceramic or other insulating substrate, as part of a thick-film hybrid integrated circuit, involves screen printing a composition which includes a binder and particles of an electrically-conducting material. Heretofore, these compositions have usually included a solvent, a resin binder, and a vitreous component in addition to the particles of electrically-conducting material. The vitreous component was needed in order to get good adherence to the substrate. The solvent was thought to be needed in order to adjust the viscosity of the composition for printing and in order to provide a vehicle that would permit high percentage loading with conducting particles.

Conductive compositions containing vitreous material have the drawback that the vitreous components require fairly high curing temperatures, since they must be fused. This type of composition, therefore, cannot be used with substrates such as phenolic resin laminates, which are not resistant to high temperatures. Also the conducting lines which contain the vitreous material must be put down before most of the other circuit components, since the high firing temperature would damage many types of circuit components which are used on these circuits.

Solvent-containing compositions have other drawbacks. If the solvent is relatively volatile, it evaporates during the printing operation and the composition dries on the screen. This ruins the screen. If the solvent is relatively nonvolatile, the drying process on the substrate is very slow and the solvent tends to become trapped, thus forming voids and bubbles in the printed lines, which degrade electrical performance.

Still another problem has appeared in mounting very small ceramic chip capacitors on substrates. The problem is to mount the tiny capacitor flat on the substrate and at the same time make some sort of an electrical connection to the bottom face. Ordinary lead-tin solders do not adhere well to the ceramic and the capacitor frequently breaks off if such solder is used. Therefore, mounting compositions with organic binders have been tried. But the usual type of conductive composition containing both a resin binder and a solvent has proved to be unsatisfactory because a small dot of composition applied to the substrate draws itself up into a generally pyramidal shape due to surface tension and flow. When the ceramic chip is placed on top of the pyramid, it often tilts instead of lying flat, and this leads to a poor connection or a broken connection. Also, the capacitor may break.

OBJECTS OF THE INVENTION

One object of the present invention is to provide improved electrically-conducting compositions having low curing temperatures but not having the disadvantages of voids and bubbles when mounted.

Another object of the invention is to provide an improved screen-printing, electrically-conductive composition which cannot dry on the printing screen or attack the emulsion backing or nylon screen.

A further object of the invention is to provide an improved method of mounting circuit components, such as ceramic chip capacitors, on conducting areas of insulating substrates.

DESCRIPTION OF PREFERRED EMBODIMENT

The objects of the present invention are achieved using low viscosity liquid epoxy resins and hardeners as the vehicle and binder for screen-printing compositions which also include high proportions of silver powder. By using the low viscosity liquid epoxies, it has been found that solvents are not required in obtaining suitable screen-printing compositions.

The following are some examples of preferred compositions and methods of using them.

EXAMPLE I

A composition is made by milling together for several hours one part by weight of a resin mixture consisting essentially of 100 parts by weight of a liquid (epichlorhydrin-bisphenol A) base epoxy resin (Araldite resin #507 of the Ciba Co.), 85 parts by weight of a hardener consisting of methyl-4-endomethylene tetrahydrophthalic anhydride (Araldite hardener #906 of the Ciba Co.), and 1 part by weight of an accelerator which is benzyl dimethylamine (Araldite accelerator #062 of the Ciba Co.), and 4 parts by weight of silver dust. This composition can be used up to 48 hours after mixing, although preferably it should be used within 24 hours. Most previously-used screen-printing conductive compositions had to be used within a few minutes after mixing. If this composition is used to make printed conductors, it is cured at temperatures below 200° C. At about 75° C., the curing time is 2 hours. At 125–150° C., the curing time is 30 minutes.

The composition can be used to mount a ceramic chip capacitor as follows. A small area of the composition is screen printed on the substrate where the capacitor is to be mounted. Close examination of the screened-on area will show that the area remains flat for a considerable period of time and exhibits a grid-like or waffle-like surface appearance, since it retains the pattern of the screen for a long period. While the composition still shows the grid-like surface, one face of the capacitor is simply pressed down into the composition and the composition is cured as described above. The capacitor remains flat and untilted, since there is no apex or peak in the screened-on area, and the connection has very low resistivity since there are no voids or bubbles or residual thinners in the composition after mounting is completed.

EXAMPLE II

Another good conductive composition can be made by milling together one part by weight of a resin mixture consisting essentially of 25 parts by weight of a low viscosity unmodified liquid epoxy resin of the bisphenol A type (Araldite resin #6010 of the Ciba Co.), 20 parts by weight of a resin hardener which is Araldite hardener #906 of the Ciba Co., 0.25 part by weight of an accelerator which is Araldite accelerator #1062 of the Ciba Co., and 3–4 parts by weight of silver powder.

Other low viscosity liquid modified or unmodified epoxy resins can be used, such as the cyclo aliphatic types. The viscosity should be less than about 400 centipoises at 25° C. and preferably about 2100–3600 centipoises at 25° C. Other acid anhydride and modified amine type resin hardeners can also be used. Examples of other accelerators are tri(dimethyl amino methyl) phenol and dimethyl amino methyl phenol.

What is claimed is:

1. A method of electrically connecting and mounting a hybrid circuit component on an insulating substrate having an electrically conducting portion thereon comprising:

depositing on said portion, by screen printing, a solventless composition comprising:

1 part by weight of a resin mixture consisting essentially of a low viscosity liquid epoxy resin having a viscosity of less than about 4000 centipoises at 25° C., and a hardener therefor, 3 to 4 parts by weight of silver powder, the composition having a viscosity such that it shows a grid pattern from the screen for a time after printing, placing said component on said composition while it still shows said grid pattern, and curing said resin at temperatures below 200° C. with said component adhered thereto.

2. A method according to claim 1 in which said circuit component is a ceramic chip capacitor.

References Cited

UNITED STATES PATENTS

| | | | |
|---|---|---|---|
| 3,290,756 | 12/1966 | Dreyer | 29—626 |
| 3,202,596 | 8/1965 | Canevari | 156—330 |
| 3,580,776 | 5/1971 | Shenfil | 156—330 |

CARL D. QUARFORTH, Primary Examiner

F. M. GITTES, Assistant Examiner

U.S. Cl. X.R.

29—626; 156—297, 330

UNITED STATES PATENT OFFICE
CERTIFICATE OF CORRECTION

Patent No. 3,676,252 Dated 7/11/72

Inventor(s) Trevor Richard Allington

It is certified that error appears in the above-identified patent and that said Letters Patent are hereby corrected as shown below:

Col. 3, line 1, change "400" to -- 4000 ---.

Signed and sealed this 15th day of January 1974.

(SEAL)
Attest:

EDWARD M. FLETCHER, JR.
Attesting Officer

RENE D. TEGTMEYER
Acting Commissioner of Patents